(12) United States Patent
Lu et al.

(10) Patent No.: US 6,784,093 B1
(45) Date of Patent: Aug. 31, 2004

(54) COPPER SURFACE PASSIVATION DURING SEMICONDUCTOR MANUFACTURING

(75) Inventors: Jiong-Ping Lu, Richardson, TX (US); Changfeng Xia, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/608,921

(22) Filed: Jun. 27, 2003

(51) Int. Cl.[7] ........................................... H01L 21/4763
(52) U.S. Cl. ..................... 438/626; 438/631; 438/633; 438/687; 438/691; 438/692; 438/694; 438/695; 438/768; 438/906; 438/958
(58) Field of Search .................. 438/626, 631, 438/633, 687, 690–695, 697, 768, 780, 906, 958

(56) References Cited

U.S. PATENT DOCUMENTS 6,656,241 B1 * 12/2003 Hellring et al. ............... 51/308
6,723,631 B2 * 4/2004 Noguchi et al. ............. 438/618
2002/0042193 A1 * 4/2002 Noguchi et al. ............. 438/618
2004/0067649 A1 * 4/2004 Hellring et al. ............. 438/689

OTHER PUBLICATIONS

Paul E. Laibinis et al. "Self–Assembled Monolayers of n–Alkanethiiolates on Copper are Barrier Films That Protect the Metal Against Oxidation by Air" American Chemical Society 1992, pp. 9022–9028

* cited by examiner

Primary Examiner—Lynne A. Gurley
(74) Attorney, Agent, or Firm—Rose Alyssa Keagy; W. James Brady, III; Frederick J. Telecky, Jr.

(57) ABSTRACT

An embodiment of the invention is a method to reduce the corrosion of copper interconnects 90 by forming a thiol ligand coating 130 on the surface of the copper interconnects 90.

30 Claims, 3 Drawing Sheets

US 6,784,093 B1

COPPER SURFACE PASSIVATION DURING SEMICONDUCTOR MANUFACTURING

FIELD OF THE INVENTION

This invention relates to the prevention of copper corrosion during the integrated circuit manufacturing process when copper is used as the interconnect material.

DETAILED DESCRIPTION OF THE INVENTION

The use of a passivation layer that coats the copper interconnects during the fabrication of copper interconnects will minimize the occurrence of copper corrosion. The present invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention.

Figure 1:
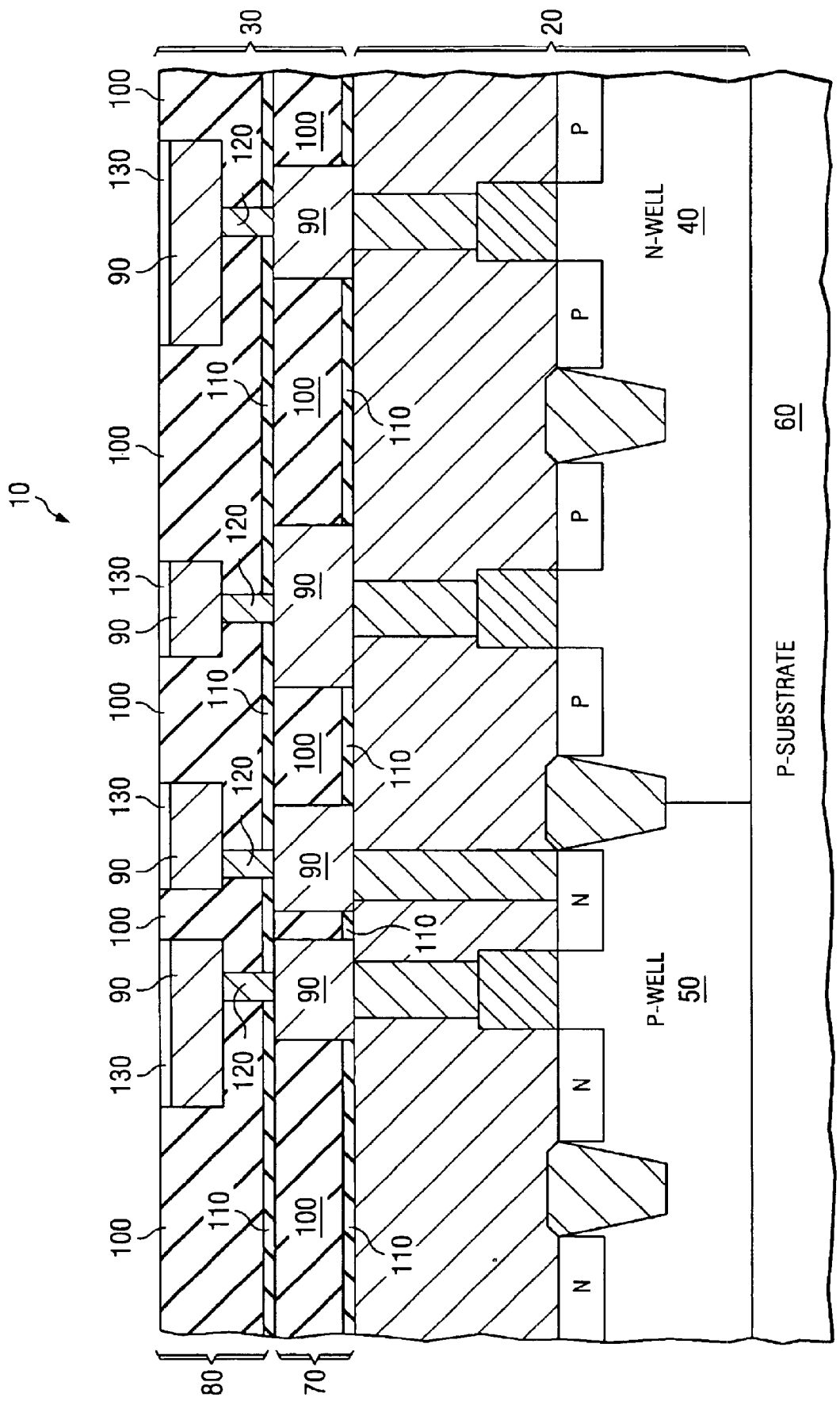
FIG. 1 is a cross-sectional view of a partially fabricated semiconductor wafer in accordance with the present invention.

Referring to the drawings, FIG. 1 depicts a portion 10 of an integrated circuit formed in a semiconductor wafer in accordance with the present invention. The wafer portion 10 is divided into two sections: a front-end structure 20 and a back-end structure 30. The example front end structure 20 contains Field Effect Transistors ("FET's") that are formed within the n-well 40 and p-well 50 of the semiconductor substrate 60. However, the front-end structure doesn't contain only FET's. It is within the scope of the invention to have any form or combination of logic within the front-end structure. For example, the front-end structure may contain active elements, passive elements. different transistor configurations, or different well and substrate technologies.

The example back-end structure 30 of the semiconductor wafer portion 10 shown in FIG. 1 has a single damascene metal interconnect layer 70 formed over the front-end structure plus a dual damascene metal interconnect layer 80 formed over the single damascene metal interconnect layer 70. Both interconnect layers 70, 80 contain metal interconnects 90 (also called "trenches") that properly route electrical signals and power throughout the integrated circuit. In the example application, the metal interconnects 90 are comprised of copper.

The interconnect layers 70, 80 also contain regions of dielectric material 100 plus a thin dielectric barrier layer 110 that electrically insulate the metal interconnects 90. In addition to the interconnects 90, the dual damascene layer 80 has vias 120 that are also comprised of copper material. The vias 120 provide the desired electrical connections between the metal interconnects 90 of the interconnect layers 70 and 80.

A semiconductor wafer is typically exposed to oxygen at several stages in the manufacturing process. Therefore, metal corrosion can occur during manufacturing processes such as copper chemical mechanical polishing (Cu CMP) or post Cu CMP cleanup (i.e. prior to the deposition of the next layer). The corrosion created during or after such processes may result in yield problems (i.e. the integrated circuits don't pass manufacturing tests) or reliability problems (i.e. the integrated circuits don't operate properly for their rated life expectancy).

Referring again to FIG. 1, the problem of corrosion can be reduced or eliminated by forming a thiol ligand coating 130 at the top surface of the metal interconnects 90 of the dual damascene metal interconnect layer 80. Even though the example application shown in FIG. 1 uses the thiol ligand coating 130 on the dual damascene interconnect layer 80, it is within the scope of this invention to use the thiol ligand coating 130 with any interconnect layer such as the single damascene metal interconnect layer 70 or a subsequent interconnect layer (not shown) formed over the dual damascene interconnect layer 80. In the best mode application the thiol ligand coating 130 is a self-assembled monolayer ("SAM"). However, any thickness of thiol ligand coating 130 is within the scope of the invention.

Figure 2:
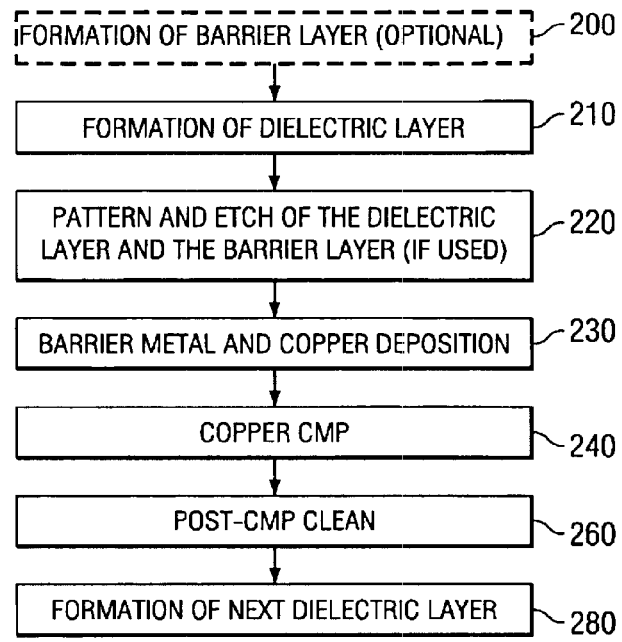
FIG. 2 is a flow diagram illustrating the process flow of the present invention.

Referring again to the drawings, FIG. 2 is a flow chart illustrating the process flow of the present invention. Other than process steps 240, 260 and 280, the process steps should be those that are standard in the industry.

If used, a layer of barrier dielectric material 110 is formed (step 200) over the entire semiconductor wafer at the beginning of the fabrication of an interconnect layer 70, 80 of the back-end structure 30. The barrier layer 110 functions as a via etch stop layer and it may be formed using any manufacturing process such as Plasma-Enhanced Chemical Vapor Deposition ("PECVD"). In this example application, the barrier layer 110 is comprised of SiC; however, other dielectric materials such is SiN or SiCN may be used.

A layer of dielectric material 100 is now formed (step 210) over the entire wafer (i.e. over the barrier layer 110). The dielectric material may be applied to the substrate with a Chemical Vapor Deposition ("CVD") or a spin-on manufacturing process. In the example application, the layer of dielectric material 100 is a low-k OSG material such as CORAL (manufactured by Novellus). However, any other low-k dielectric or combination of dielectrics maybe used. Next (step 220) the barrier layer 110 and the dielectric layer 100 are patterned (using photoresist) and etched (possibly using a fluorocarbon-based plasma etch) to form the desired spaces for the trenches 90 and/or the vias 120 of the copper interconnects.

The interconnect layer 70, 80 is completed by forming the copper via 120 and/or trench 90 structures. A barrier metal (such as Ta, TaN or TaN/Ta bilayer) is deposited (step 230) to prevent copper diffusion into the dielectric layer and also to improve the adhesion between the copper interconnect and the dielectric layer, and is followed by the copper seed. Bulk copper is then deposited onto the wafer to fill the spaces for the trenches 90 and/or vias 120; typically through an electrochemical deposition process. A Chemical Mechanical Polishing (CMP) process is then used (step 240) to remove the excessive copper, planarize the surface, and create the copper interconnects 90. In the example application, a Mira (manufactured by AMT) is used to perform the copper CMP.

Figure 3A:
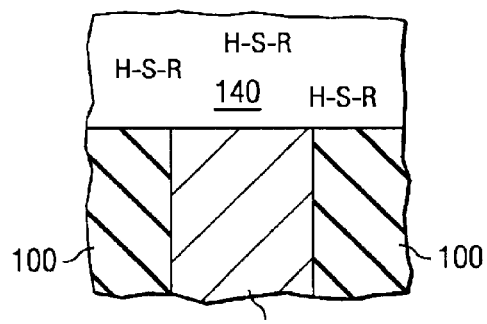
FIGS. 3A and 3B illustrate copper surface passivation through covalent reaction in accordance with the present invention.
Figure 3B:
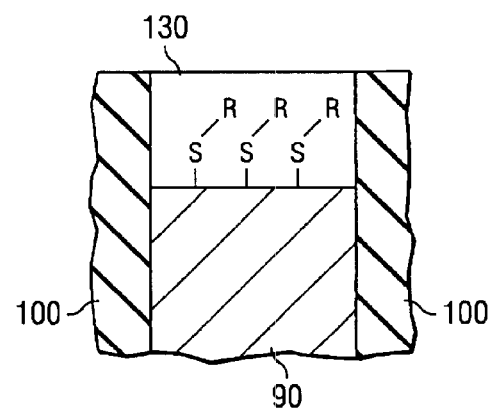

In the best mode application of step 240, the slurry used during the CMP process does not contain the common anti-corrosion additive Benzotriazole ("BTA"). Rather, in the best mode application a thiol solution is added the CMP slurry. During the CMP process the exposed copper reacts with the thiol solution to form a SAM coating 130 through a covalent reaction. More specifically, as shown in FIGS. 3A and 3B, the exposed surface of the copper interconnect 90 is highly reactive towards thiol ligand—SR (where S=Sulfur and R=any organic ligand having a sufficient chain length). Therefore, a thiol solution is added to the CMP slurry 140 so that a SAM 130 of —SR can be formed on the surface of copper 90. The thiol solution is H—S—S, where H represents hydrogen, S represents sulfur, and R represents an alkyl ligand—namely $R=C_nH_{2n+1}$. More specifically, in the best mode application n=16 and therefore $R=C_{16}H_{33}$.

The hydrogen and sulfur form a bond in the thiol solution as shown in FIG. 3A. However, as shown in FIG. 3B, when the H—S—S molecule is exposed to the copper molecule the hydrogen atoms will break away and the sulfur atoms will form a covalent bond with the copper ions. This reaction causes the formation of a uniform, self-assembled monolayer 130 on the exposed surface of copper 90.

The SAM passivation coating 130 provides a reliable oxidation barrier that protects against copper corrosion after copper CMP. In addition, the monolayer structure reduces the amount of organic residue in the CMP process. It should be noted that in this application the passivation layer 130 only coats the surface of copper, as indicated in FIGS. 1 and 3B.

Referring again to FIG. 2 and continuing with the best mode application, a post-CMP clean (step 260) is now performed to remove slurry residues and other by-products from the polished wafer surface. In an example application, the post-CMP clean is performed using a Verteq solvent hood (manufactured by Verteq) or a DNS Solvent Hood (manufactured by DNS). After the residues are removed the wafers are dipped in a thiol solution and spun dry. This additional exposure of the surface of copper 90 to the thiol solution in the best mode application ensures that the surfaces of copper interconnects 90 have a complete and uniform surface passivation coating. Preferably, the thiol solution dipping process is performed using the same clean-up hood as the post-CMP clean process in order to prevent any corrosion during wafer transfer.

Figure 4:
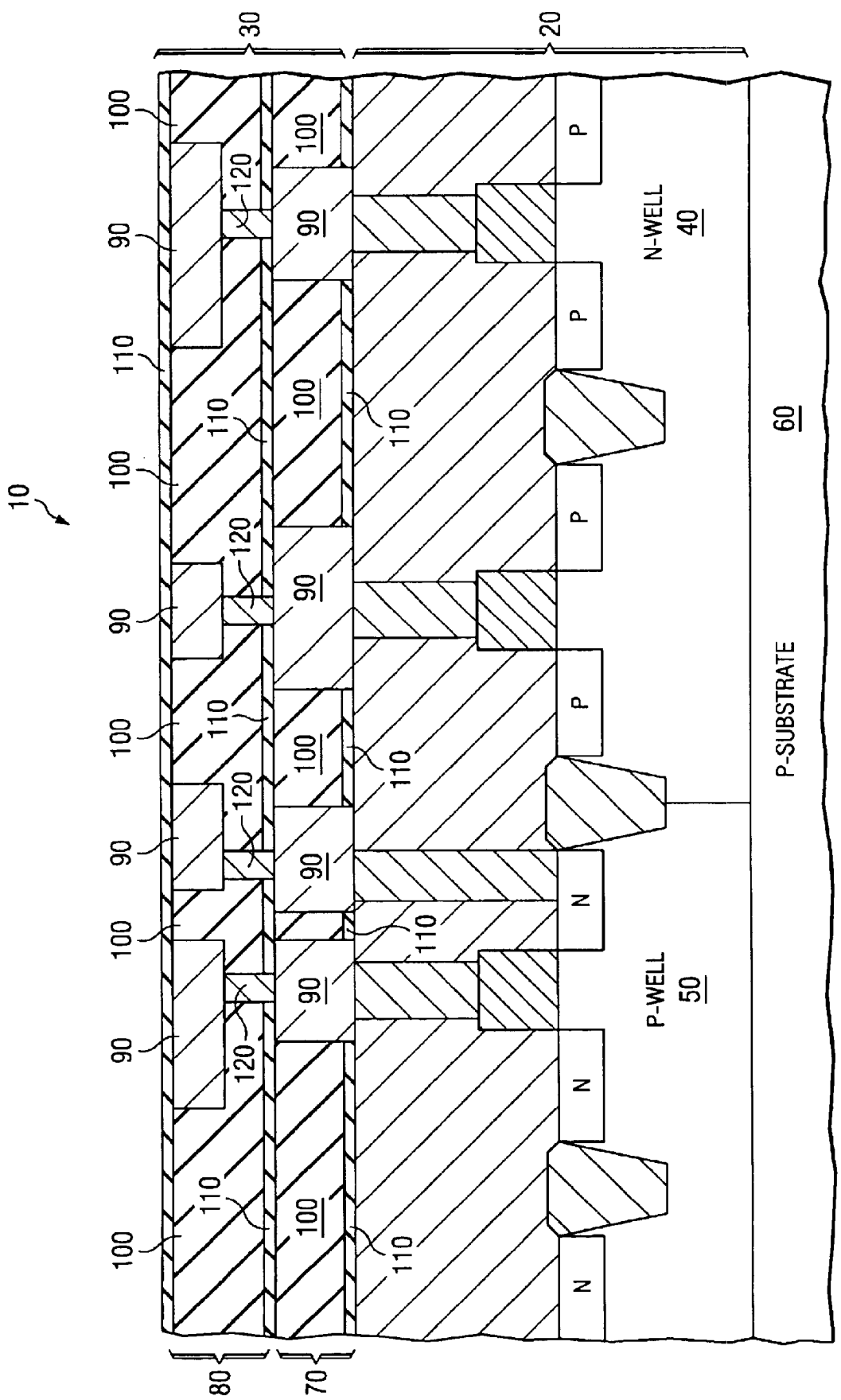
FIG. 4 is a cross-sectional view of a partially fabricated semiconductor wafer in accordance with the present invention.

Referring again to the drawings, FIG. 4 shows the next process step 280. In process step 280 another layer of dielectric 110 is formed over the wafer. This dielectric is the passivation or etch stop layer of the next interconnect layer and it may be comprised of a material such as SiC. In the example application, a Centura (manufactured by AMT) is used to perform the pre-treatment of the wafer and the deposition of the etch stop layer. In the best mode application, $NH_3$ plasma is used during the pre-treatment process to remove the —SR layer 130 from the surface of copper interconnects 90. Once the pre-treatment process is complete, the etch stop layer is deposited over the surface of the wafer.

The fabrication process now continues until the integrated circuit structure is complete. It should be noted that many variations in steps 240, 260 and 280 are within the scope of this invention. For example, in one alternative embodiment the thiol solution is added to the CMP slurry but the wafers are not dipped in a thiol solution following post-CMP clean. In another alternative embodiment, a (preferably small) quantity of BTA may be added to the CMP slurry. In this alternative embodiment, the attached BTA material is later removed from the semiconductor wafer (along with the —SR monolayer) during plasma pre-treatment.

Various additional modifications to the invention as described above are within the scope of the claimed invention. As an example, instead of dipping the wafers in a thiol solution after post-CMP clean, the wafers may be exposed to a thiol solution by another method such as spraying. In addition, instead of using $NH_3$, other hydrogen containing plasmas may be used during the pre-treatment process before the deposition of the etch stop layer. Moreover, R may be any organic ligand, preferably with an effective chain length$\geq$16. Similarly, instead of n=16, the number of molecules may range from 12 to 25.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing a copper interconnects on a semiconductor wafer comprising:

polishing a copper interconnect layer to form said copper interconnects, said polishing step including the use of a slurry that contains BTA;

cleaning said semiconductor wafer;

exposing said semiconductor wafer to a H—S—S solution to form a S—R layer over said copper interconnects; and depositing a layer of dielectric material over said semiconductor wafer after removing said S—R layer with an in-situ plasma pretreatment of said semiconductor wafer with a hydrogen containing plasma.

2. The method of claim 1 wherein said cleaning step and said exposing step are performed in-situ.

3. The method of claim 1 wherein said hydrogen containing plasma is $NH_3$.

4. The method of claim 1 wherein said exposing step comprises dipping said semiconductor wafer in said H—S—S solution.

5. The method of claim 1 wherein said exposing step comprises spraying said semiconductor wafer with said H—S—S solution.

6. The method of claim 1 wherein said S—R layer is a monolayer.

7. The method of claim 1 wherein $R=C_nH_{2n+1}$.

8. The method of claim 7 wherein n=16.

9. The method of claim 7 wherein 12<n<25.

10. The method of claim 1 wherein said slurry also contains an H—S—S solution.

11. A method of manufacturing copper interconnects on a semiconductor wafer comprising:

forming a S—R layer over said copper interconnects by polishing a copper interconnect layer with a slurry that includes H—S—S;

cleaning said semiconductor wafer:

exposing said semiconductor wafer to a H—S—S solution; and depositing a layer of dielectric material over said semiconductor wafer after removing said S—R layer with an in-situ plasma pretreatment of said semiconductor wafer with a hydrogen containing plasma.

12. The method of claim 11 wherein said hydrogen containing plasma is $NH_3$.

13. The method of claim 11 wherein said forming step, said cleaning step, and said exposing step are performed in-situ.

14. The method of claim 11 wherein said cleaning step and said exposing step are performed in-situ.

15. The method of claim 11 wherein said exposing step comprises dipping said semiconductor wafer in said H—S—R solution.

16. The method of claim 11 wherein said exposing step comprises spraying said semiconductor wafer with said H—S—R solution.

17. The method of claim 11 wherein $R=C_nH_{2n+1}$.

18. The method of claim 17 wherein n=16.

19. The method of claim 17 wherein 12<n<25.

20. The method of claim 11 wherein said S—R layer is a monolayer.

21. A method of manufacturing copper interconnects on a semiconductor wafer comprising:

forming said copper interconnects by polishing a copper interconnect layer with a slurry that includes H—S—S, said polishing step also forming a S—R layer over said copper interconnects;

cleaning said semiconductor wafer; and depositing a layer of dielectric material over said semiconductor wafer after removing said S—R layer with an in-situ plasma pretreatment of said semiconductor wafer with a hydrogen containing plasma.

22. The method of claim 21 wherein said slurry farther includes BTA.

23. The method of claim 21 wherein said hydrogen containing plasma is $NH_3$.

24. The method of claim 21 wherein said forming step and said cleaning step are performed in-situ.

25. The method of claim 21 wherein $R=C_nH_{2n+1}$.

26. The method of claim 25 wherein n=16.

27. The method of claim 25 wherein 12<n<25.

28. The method of claim 25 wherein R is an organic ligand with a carbon length $\geq 16$.

29. The method of claim 21 wherein said S—R layer is a monolayer.

30. The method of manufacturing a copper interconnects on a semiconductor wafer comprising:

forming said copper interconnects by polishing a copper interconnect layer with a slurry that includes $HSC_{16}H_{33}$, said polishing step also forming a S—R monolayer over said copper interconnects;

cleaning said semiconductor wafer;

dipping said semiconductor wafer in a solution containing $HSC_{16}H_{33}$, said dipping step performed in-situ with said cleaning step; and depositing a layer of dielectric material over said semiconductor wafer after removing said S—R monolayer with an in-situ plasma pretreatment of said semiconductor wafer with a $NH_3$ plasma.

* * * * *